| United States Patent [19] | [11] Patent Number: 4,940,851 |
|---|---|
| Oyobe et al. | [45] Date of Patent: Jul. 10, 1990 |

[54] MEMBRANE FOR USE IN X-RAY MASK AND METHOD FOR PREPARING THE SAME

[75] Inventors: Akira Oyobe, Yokohama; Toshihiko Maeda, Tokyo; Hiroyuki Nakae, Kawasaki; Toshio Hirai, 4-91, Takamori 3-chome, Izumi-shi, Miyagi; Tsuyoshi Masumoto, 8-22, Kamisugi 3-chome, Sendai-shi, Miyagi, all of Japan

[73] Assignees: Research Development Corporation of Japan, Tokyo; Toshio Hirai, Izumi; Tsuyoshi Masumoto, Sendai; The Furukawa Electric Co., Ltd., Tokyo, all of Japan

[21] Appl. No.: 111,996

[22] Filed: Oct. 21, 1987

[30] Foreign Application Priority Data

Oct. 31, 1986 [JP] Japan .............................. 61-258337

[51] Int. Cl.$^5$ ...................... C03C 03/11; C04B 35/58; C03G 15/08
[52] U.S. Cl. ........................................ 501/56; 501/96; 430/56; 430/62; 430/63; 430/84
[58] Field of Search ...................... 501/96, 56; 430/84, 430/56, 62, 63

[56] References Cited

U.S. PATENT DOCUMENTS

| 4,222,760 | 9/1980 | Chyung et al. | 501/56 |
|---|---|---|---|
| 4,265,991 | 5/1981 | Hirai et al. | 430/64 |
| 4,451,547 | 5/1984 | Hirai et al. | 430/128 |
| 4,507,375 | 3/1985 | Hirai et al. | 430/128 |
| 4,540,674 | 9/1985 | Watanabe et al. | 501/97 |
| 4,552,824 | 11/1985 | Hirai et al. | 430/64 |

FOREIGN PATENT DOCUMENTS

| 56-026771 | 3/1981 | Japan | 501/96 |
|---|---|---|---|
| 57-039153 | 3/1982 | Japan | 501/96 |
| 59-169982 | 9/1984 | Japan | 501/96 |
| 2072220 | 9/1981 | United Kingdom | 501/97 |
| 1603449 | 11/1981 | United Kingdom | . |

*Primary Examiner*—Mark L. Bell
*Assistant Examiner*—Anthony J. Green
*Attorney, Agent, or Firm*—Flynn, Thiel, Boutell & Tanis

[57] ABSTRACT

A membrane for use in an X-ray mask composed of a compound comprising at least three kinds of elements of boron (B), silicon (Si) and nitrogen (N) in which the content of silicon in the compound is at least 15 atomic percent, but less than 100 atomic percent, and the atomic ratio of Si/(B+Si) in the compound is at least 0.2, but less than one. The membrane is synthesized from source gases including at least the foregoing three kinds of elements by chemical reaction under such conditions that the ratio of nitrogen to boron plus silicon is at least one in the source gases and thereby depositing a film of the compound onto a substrate. Since the membrane thus prepared has a high transmittance in the visible region and X-ray and their residual stress can be readily controlled by adjusting the conditions for the formation of the membrane, it is suitable for the preparation of X-ray masks.

8 Claims, 4 Drawing Sheets

MEMBRANE FOR USE IN X-RAY MASK AND METHOD FOR PREPARING THE SAME

BACKGROUND OF THE INVENTION

The present invention relates to membranes for use in X-ray masks and, more particularly, thin films of B—Si—N system compounds whose residual stress is easily controlled and which exhibit a superior ability to transmit visible light employed for alignment and, further, to a method for preparing same.

In recent years, as transferring techniques for semiconductor integrated circuits which have become progressively finer, an exposure process using X-rays as a light source has been extensively studied or investigated.

X-rays masks used as original patterns in such a transferring process are made in such a basic structure that a desired pattern consisting of a material capable of preventing transmission of X-ray is formed onto a membrane (film) allowing transmission of X-ray which is tightly formed in an appropriate tension by a supporting frame arranged at the periphery of the membrane.

The membranes used in such X-ray masks are required to be superior in the following properties. (1) X-ray transmission, (2) flatness, (3) dimensional stability in plane, (4) mechanical strength, (5) transmission in the visible region, (6) chemical stability, etc. Among these properties, flatness and dimensional stability in plane are particularly significant in transferring with high precision and, for this purpose, the membrane should be placed in an appropriately strained condition by applying a low tension thereto. An excess tension leads to an increase in the distortion of the resulting X-ray mask and a reduction in the strength of the membrane. Compressive force is also unfavorable, since flexure problems arise. Further, in the exposure procedure, alignment is performed, for example, with the aid of diffraction of laser beam. Therefore, the membranes desirably have a high transmittance in the visible light region. Silicon nitride (hereinafter referred to as SiNx) and boron nitride (BNx) are greatly expected to be useful as membrane materials meeting the requirements set forth above and have been actually used for various studies.

The membranes made of those materials are usually formed onto an inorganic substrate such as silicon, etc., by thermal decomposition chemical vapor deposition (thermal CVD) or radio-frequency plasma chemical vapor deposition (RF plasma CVD) and then the central part of the substrate is removed by means of an etching process. The un-etched peripheral portion of the substrate is used as a supporting frame.

However, generally, in the BNx films prepared by CVD, compressive stress tends to remain and, in the SiNx films, a high tensile stress tends to remain. Therefore, attention is directed to control such tendencies.

Under such circumstances, there are currently single layered films of CVD-BNx or CVD-SiNx in which reduced residual tension has been actually realized and their stress has been controlled by intentionally preparing a composition having a deficiency in nitrogen relative to a stoichiometric composition (BN or $Si_3N_4$). In this case, the optical absorption in the ultraviolet-visible region is increased due to an excess of silicon or boron. Consequently, transmittance in the visible region is inevitably, more or less, sacrificed in X-ray masks employing the membranes of these substances. Specifically, an example of the SiNx films is discussed by Sekimoto et al., in Journal of Vacuum Science and Technology, Vol. 21, page 1017 (1982) and an example of the BNx films is discussed by Dana and Maldonado, ibid., Vol. B4, page 235 (1986); or by Adams and Capio in Journal of Electrochemical Society, Vol. 127, page 399 (1980). Although the boron nitride films reported in the articles also contain hydrogen in a relatively large amount, the films are described in this specification as BNx films for simplification.

Alternatively, various attempts have been made in order to cancel out or control stress by stacking plural films having a different internal stress. For example, in Japanese Journal of Applied Physics, Vol. 20, page L669 (1981), Sekimoto et al reported a method of providing a trilayer structure of SiNx, $SiO_2$ and SiNx. Further, in Journal of Vacuum Science and Technology, Vol. B4, page 221 (1986), Suzuki and Matsui describe that relaxation of the stress of a SiNx film can be effected by interposing an $SiO_2$ film between the SiNx film and a silicon supporting frame, and thereby X-ray masks having a superior flatness can be obtained. However, needless to say, in such multilayered films, the production process thereof becomes complicated.

As further film formation processes, plasma CVD using electron cyclotron resonance (ECR) and sputtering are exemplified and most of those processes require certain extra procedures for controlling residual stress. Kiuchi et al reported in Extended Abstracts of the 44th Meeting of the Japan Society of Applied Physics (1983), page 236 that, in X-ray masks using $Si_3N_4$ prepared by ECR plasma deposition process, the stress was controlled by thermal treatment after the film formation process. Further, at the same page of the Abstracts, Mochiji et al proposed a method for controlling stress by stacking a CVD-SiNx film on a BNx film formed by RF sputtering.

As a further method for controlling the residual stress, there may be mentioned the addition of a third element. For instance, with respect to the Si—O—N system, it has been reported by Rand and Roberts in Journal of Electrochemical Society, Vol. 120, page 446 (1973) and Csepregi and Heuberger in journal of Vacuum Science and Technology, Vol. 16, page 1962 (1979) that tensile stress can be reduced by increasing the oxygen content. However, such films are far inferior to nitride films in resistance to etching.

Further, U.S. Pat. Nos. 4 171 489 and 4 253 029 disclose processes for obtaining films having a low tension and an ability to transmit light by doping up to about 10 atomic % Si (U.S. Pat. No. 4 171 489) and 1–7 atomic % Si (U.S. Pat. No. 4 253 029) into BNx. Also, similar Si-doped BN films are described by Retajczyk, Jr and Sinha in Applied Physics Letters, Vol. 36, page 161 (1980).

BNx and SiNx films synthesized from the vapor phase are superior in the ability to transmit X-rays, mechanical strength and chemical stability and, thus, are suitable as membranes for use in X-rays masks.

However, in the X-ray masks using these nitride films, controlling their residual stress, which is caused during film formation and causes strain in the resulting films, has become an important problem.

For this, the currently used X-ray masks have the problems as set forth above. That is, the masks are inferior in transmission properties in the visible region or require multilayering process of two or more kinds of films or extra thermal treatment after film formation.

SUMMARY OF THE INVENTION

In view of the foregoing problems, it is an object of the present invention to provide a membrane for use in an X-ray mask in which the residual stress is readily controlled and the membrane has a superior ability to transmit the visible light employed for alignment.

According to the present invention, there is provided 1) a membrane for use in an X-ray mask in which the membrane is composed of a compound comprising at least three kinds of elements, boron (B), silicon (Si) and nitrogen (N). In the compound, the content of silicon is at least 15 atomic percent, but less than 100 atomic percent, and the atomic ratio of Si/(B+Si) is at least 0.2, but less than one.

Further, the present invention is directed to (2) a method for preparing the membrane specified above which comprises synthesizing the compound from source gases including at least the foregoing three elements, i.e., B, Si and N, by chemical reaction under such conditions that the atomic ratio of nitrogen to boron plus silicon, N/(B+Si), in the source gases is at least one, and thereby depositing a film of the compound onto a substrate.

The present Inventors have found that films having an appropriate tensile stress and thereby suitable as membranes for X-ray masks can be obtained by controlling the composition of the films of the foregoing B—Si—N system compound. The present invention was reached on the basis of such a finding. According to the present invention, since the residual stress can be controlled without intentionally preparing a composition having a deficient nitrogen content relative to a stoichiometric ratio, X-ray masks exhibiting a high transmittance in the visible region can be prepared.

The B—Si—N system compound films of the present invention set forth above are entirely different in the composition from the Si-doped BN films described in the above U.S. Pat. Nos. 4 171 489 and 4 253 029 and the report by Retajczyk and Sinha and provide novel membranes suitable for use in X-ray masks.

DETAILED DESCRIPTION OF THE PREFERRED EMBODIMENTS

The present invention will now be described in detail hereinafter.

The B—Si—N system compound film specified above is synthesized, for example, by a thermal CVD method. Diborane ($B_2H_6$) for a boron source gas, monosilane ($SiH_4$) for a silicon source gas and ammonia ($NH_3$) for a nitrogen source gas are preferably employed as source gases. $H_2$ or inert gases such as $N_2$, He, Ar, etc., are employed as a diluent gas for the source gases.

In a preferable embodiment for practicing the process of the present invention, the temperature of a substrate is set in the range of 700 to 1000° C. The source gases of B, Si and N are fed in proportions such that the atomic ratio of Si/(B+Si) is not less than 0.4 but less than one, and the atomic ratio of N/(B+Si) is in the range of 10 to 50 and the total gas pressure is from 0.1 to 30 Torr. Under such conditions, there can be synthesized good quality films having a dense, homogeneous and smooth surface and superior in light transmission and chemical stability.

As the substrate, thermally and mechanically stable materials, such as silicon, silica glass, sapphire, etc., may be used. Particularly, a (100) oriented single crystal silicon substrate is preferable since when the substrate is used under the foregoing conditions, a film having a low residual tension of $0.5 \times 10^8$ to $20 \times 10^8$ dync/cm$^2$ can be obtained. Although films of low tension can be obtained under the processing conditions outside the ranges specified above, they tend to be inferior in smoothness, homogenity and/or light transmission.

As the source gases of boron, silicon and nitrogen, other source gases may be selected appropriately from those which have been used in the vapor phase synthesis of BNx and SiNx films heretofore known, and, as examples of such source gases, triethylboron [$B(C_2H_5)_3$], boron trichloride ($BCl_3$), borazine ($B_3N_3H_6$), dichlorosilane ($SiH_2Cl_2$), disilane ($Si_2H_6$), silicon tetrachloride ($SiCl_4$), hydrazine ($N_2H_4$), etc. may be mentioned.

Further, other vapor phase synthesizing processes such as CVD or sputtering processes utilizing, as means for activating source gases, RF plasma, microwave plasma, ECR plasma or laser may be employed. In these processes, $N_2$ gas may be also used as a nitrogen source gas.

A composite article consisting of the B—Si—N system compound film obtained above and the substrate is processed into an X-ray mask in accordance with the known procedure as set forth below.

The film thickness of the membrane of the present invention is preferably from 0.5 to 10 μm and more preferably 1 to 3 μm from the viewpoint of mechanical strength and X-ray transmission

EXAMPLE 1

In order to show the effects of the present invention, the following examples will now be explained with reference to the accompanying drawings and tables.

Figure 1:
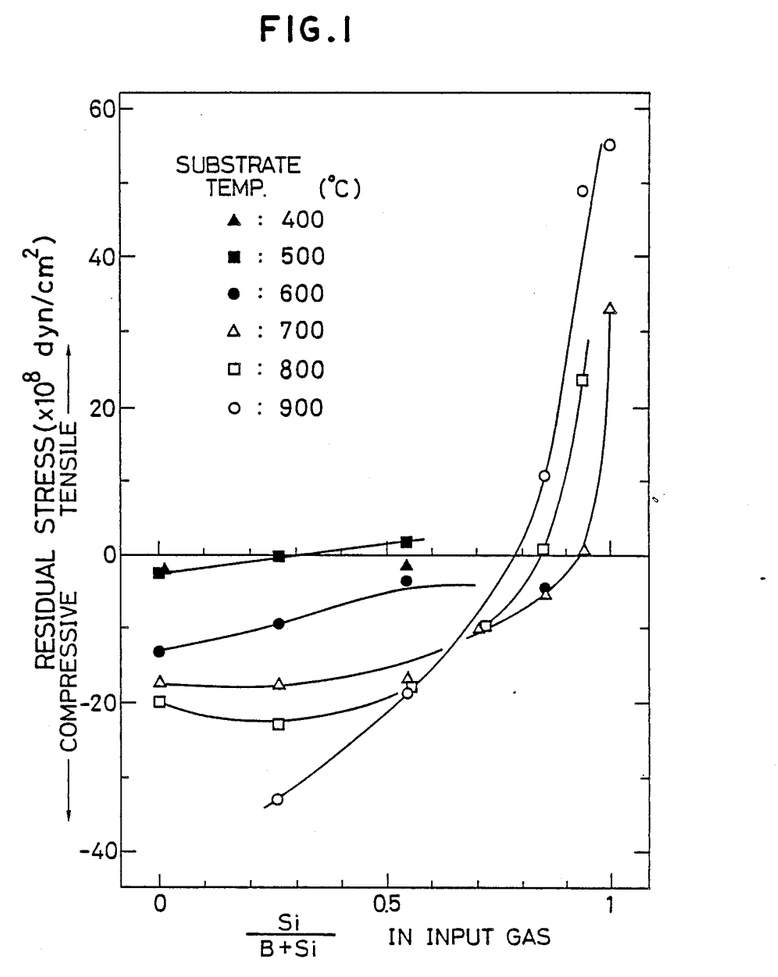
FIG. 1 is a graph illustrating the residual stress of the B—Si—N system compound films of Example 1 according to the present invention.

FIG. 1 is a graph showing the residual stress of B—Si—N system compound films which were prepared on a (100) oriented single crystal silicon substrate at substrate temperatures of 400 to 900° C. with the total gas pressure within the reaction chamber maintained at 10 Torr, using $B_2H_6$ diluted with hydrogen gas (1 or 5% $B_2H_6$ gas), $SiH_4$ diluted with hydrogen gas (5% $SiH_4$ gas), and $NH_3$, as source gases. For the film formation, a thermal CVD apparatus of a cold-wall type was employed. In the figure, there are shown positive values for tensile stress and negative values for compressive stress. The numbers on the abscissa indicate the atomic ratio of Si/[B+Si] in the input source gases. The total flow rate of $B_2H_6$ and $SiH_4$ was adjusted to 3 sccm [standard cm$^3$/min(cubic centimeter per minute)] and the flow rate of $NH_3$ was adjusted 60 sccm. Besides the foregoing source gases, Ar gas was introduced into the reaction chamber at a flow rate of 120 sccm.

As will be clear from the figure, the residual stress can be easily controlled by adjusting the atomic ratio of Si/(B+Si) in the input source gases. The film thickness was typically about 1.4 μm.

A further synthesis was conducted under the same conditions as described above except that only the flow rates of the source gases were changed to 2 sccm for $B_2H_6$ plus $SiH_4$ and 80 sccm for $NH_3$. The residual stress change of this case was almost the same as the behavior shown in FIG. 1.

In a series of the foregoing experiments, the films having a low tensile stress which were obtained at substrate temperatures of not lower than 700° C. with the atomic ratio of Si/(B+Si) in the input gases adjusted to 0.8 or more were observed for their fractured faces and surfaces with a scanning electron microscope and it has found that the films all had a dense, homogeneous and smooth surface. Further, the etch rate of the films was on the order of 10 Å/min or less in an etching solution containing hydrofluoric acid and nitric acid (30% HF, 10% $HNO_3$ at room temperature) and the films were superior in chemical stability.

Figure 2:
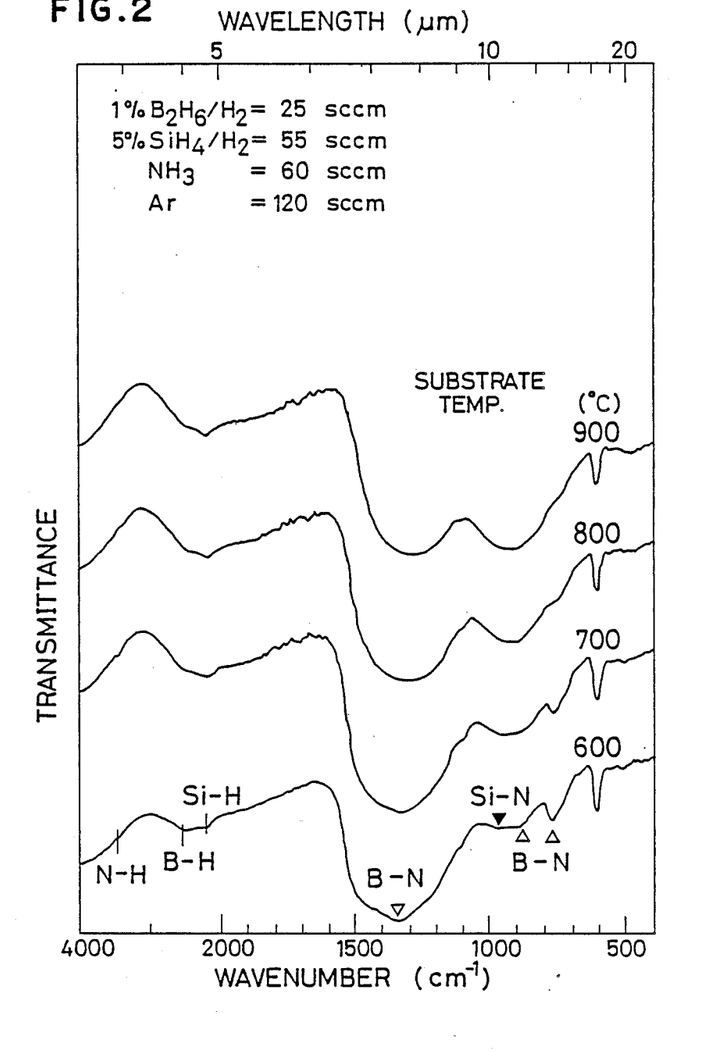
FIG. 2 shows examples of the infrared spectra of the B—Si—N system compound films in Example 1 of the present invention.

FIG. 2 shows examples of the infrared spectra of the B—Si—N compound films above mentioned. As shown in FIG. 2, it has been confirmed that B—N bonding and Si—N bonding are present in the films but absorption due to residual hydrogen has been hardly detected. The X-ray diffraction studies showed that the films were amorphous.

The compositions of the films were analyzed by using an electron probe X-ray microanalyzer (EPMA). A B—Si—N film whose composition was determined by a chemical quantitative analysis in Example 2 described hereinafter was employed as a standard sample.

The atomic ratios of Si/(B+Si) in the resultant films were increased with increases in the atomic ratios of Si/(B+Si) in the input gas. When the source gases were supplied under the same conditions, the atomic ratios of Si/(B+Si) in the films were increased with increasing the substrate temperature.

The results of the analysis for the compositions are, in part, given in Table 1 below. It is known from Table 1 that there can be obtained films having low tensions of $0.5 \times 10^8$ to $15 \times 10^8$ dynes/cm$^2$, when the silicon content is in the range of about 20 to 30 atomic % and the Si/(B+Si) atomic ratio is in the range of about 0.4 to 0.6 in the films. The quantitative measurement of the oxygen content as an impurity in the films was less than limit of detection.

Further, films were prepared on a silica glass substrate under the same conditions and their refractive index and absorption coefficient were calculated from the light transmittance curves in the ultra-violet-visible region. The results are also shown in Table 1. The percent transmittance given in this table are the maximum percent transmittance (reflectance=0) for film thickness of 2 μm at the wavelength (488 nm) of argon laser and at the wavelength (633 nm) of helium-neon laser.

As will be seen from the table, it has been confirmed that all of the films formed in a low tension on the silicon substrate, (100) orientation, have a high transmittance. Further, the refractive index of the foregoing films was on the order of 1.75 to 1.84 (±0.02) and less than the refractive index (approximately 1.9) of the Si-doped BN films described in U.S. Pat. No. 4 171 489.

The foregoing SiNx or BNx membranes in a low residual tension which were reported by Sekimoto et al; Dana and Maldonado; or Adams and Capio were all prepared with the atomic ratio of N/Si or N/B in the source gases being maintained at less than one. However, according to the present invention, even under the condition of an excess nitrogen, there can be prepared films having a low residual tension. Consequently, excess B or Si can be minimized and films having a low tension and a high transmittance in the visible light region which are suitable for use in X-ray masks can be achieved.

Since the residual stress is considered to vary depending on the preparation process and the kind of the substrate, the processing conditions are not limited only to the above conditions. For example, when the conditions for Samples 3 to 5, 7 and 8 shown in Table 1 were applied to the (100) silicon substrate, low residual stress resulted. However, when the same conditions were applied to the silica glass substrate having a thermal expansion coefficient smaller than silicon, high tensile stress was remained in all the samples. Particularly, when the condition of Sample 7 were employed, cracks occurred. The cause of the cracks is ascribable to the fact that in the case of the silica glass substrate, a higher thermal tensile stress was developed when cooling after film formation, as compared with the case of the silicon substrate. In such a case, it is possible to change the processing conditions so that the thermal stress may be cancelled by the internal stress caused during film formation.

In Table 1, for example, referring to Sample 10 in comparison with Samples 5 and 8, the substrate temperature of Sample No. 10 is the same as those of the latter two but the atomic ratio of N/(B+Si) in the input source gases of Sample No. 10 was changed to 9.2. This change in the atomic ratio of N/(B+Si) shifted the residual stress to a compressive stress side in a change of about $13 \times 10^8$ dyn/cm$^2$.

As is referred to such a result, low tension films can be also achieved in the use of the silica glass substrate by adjusting the atomic ratio of N/(B+Si) in the inlet source gases to 10 or less.

However, as is clear from the table, light transmittance in the visible region is reduced with decrease in the N/(B+Si) atomic ratio in the inlet source gases. In order to obtain absorption coefficients of not greater than $5 \times 10^3$ cm$^{-1}$ at the wavelenght of 633 nm, the atomic ratio of N/(B+Si) were required to be at least one. Preferably, the preparation of the membranes of the present invention is performed with the N/(B+Si) atomic ratio of at least 10, using a (100) oriented silicon substrate.

Also, films of low tension may be obtained when the atomic ratio of Si/(B+Si) in the source gases is not more than 0.8. For example, as shown in FIG. 1, when the atomic ratio of Si/(B+Si) is 0.54, films with a low tension could be barely attained on a silicon substrate, (100) orientation, at a substrate temperature of 500° C. However, when the atomic ratio of Si/(B+Si) in the source gases was less than approximately 0.6, a large quantity of powdered B—N—H compound was produced in the reaction chamber and the films obtained were inferior in homogeneity and surface smoothness. Further, as shown in Table 1, No. 11, such films were some what inferior in light transmitting properties.

TABLE 1

| Sample | Atomic ratio in source gases | | Substrate Temp. | Composition of films (atomic %) | Atomic ratio of |
| --- | --- | --- | --- | --- | --- |
| | Si/ | N/ | | | |

TABLE 1-continued

| No. | (B + Si) | (B + Si) | (°C.) | B | Si | N | Si/(B + Si) |
|---|---|---|---|---|---|---|---|
| 1 | 0.94 | 19.4 | 900 | 10 | 35 | 55 | 0.78 |
| 2 | 0.94 | 19.4 | 800 | 20 | 27 | 54 | 0.67 |
| 3 | 0.94 | 19.4 | 700 | 28 | 22 | 50 | 0.44 |
| 4 | 0.85 | 18.5 | 900 | 19 | 28 | 54 | 0.60 |
| 5 | 0.85 | 18.5 | 800 | 25 | 23 | 52 | 0.48 |
| 6 | 0.85 | 18.5 | 700 | — | — | — | — |
| 7 | 0.85 | 36.9 | 900 | 20 | 25 | 54 | 0.56 |
| 8 | 0.85 | 36.9 | 800 | 24 | 24 | 52 | 0.50 |
| 9 | 0.85 | 36.9 | 700 | — | — | — | — |
| 10 | 0.85 | 9.2 | 800 | 24 | 26 | 50 | 0.52 |
| 11 | 0.54 | 15.4 | 500 | 47 | 11 | 41 | 0.19 |

| Sample No. | Residual Stress* ($\times 10^8$ dydes/cm$^2$) | Refractive index $\lambda = 633$ nm | Absorption coefficient $\lambda = 400$ nm ($\times 10^3$ cm$^{-1}$) | Percent transmittance (%) Film thickness: 2 μm | |
|---|---|---|---|---|---|
| | | | | $\lambda = $ 488 nm | $\lambda = $ 633 nm |
| 1 | 49 | 1.88 | 0.27 | 96.5 | 97.3 |
| 2 | 24 | 1.84 | 0.28 | 97.9 | 98.5 |
| 3 | 0.6 | — | — | — | — |
| 4 | 11 | 1.84 | 0.33 | 98.5 | 99.5 |
| 5 | 0.5 | 1.81 | 0.90 | 95.5 | 98.4 |
| 6 | −5 | 1.76 | 1.03 | 94.5 | 98.9 |
| 7 | 15 | 1.83 | 0.13 | 98.3 | 98.6 |
| 8 | 0.6 | 1.81 | 0.23 | 98.1 | 98.8 |
| 9 | −8 | 1.75 | 0.44 | 97.5 | 99.4 |
| 10 | −12 | 1.84 | 3.5 | 82.6 | 95.4 |
| 11 | 0.7 | 1.77 | >4 | 79.4 | 95.6 |

*A (100) Si substrate was used.

EXAMPLE 2

Further synthesis of B—Si—N films is exemplified below in which a low pressure CVD apparatus of a hot wall type having a cylindrical reaction tube of silica glass was employed.

In the reaction tube having an inside diameter of 68 mm and horizontally disposed, (100) oriented silicon wafers with a diameter of 2 inches were arranged perpendicularly with respect to the axis of the reaction tube, with a 25 mm spacing and heated to 800 to 1000° C. by externally heating with a lamp furnace. When the substrate temperature was reached, source gases were introduced from one end of the reaction tube while venting at the other end using a vacuum pump so as to maintain the total gas pressure in the furnace at 0.5 Torr.

As the source gases, $B_2H_6$ and $SiH_4$, both diluted to a concentration of 5% with helium, and 100% $NH_3$ were employed. Synthesis was carried out while maintaining the sum of the flow rates of $B_2H_6$ and $SiH_4$ at 5 sccm and the flow rate of $NH_3$ at 100 sccm. At the gas inlet side of the reaction tube, a cylindrical graphite block, 2 inches in diameter and 60 mm in length, was placed in place of a dummy wafer.

Figure 3:
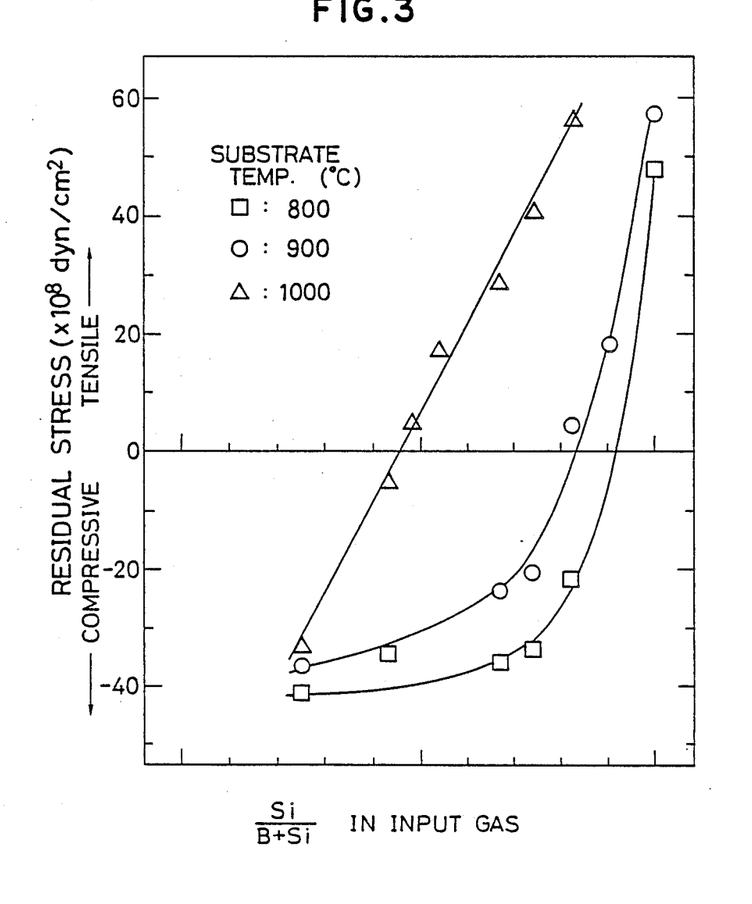
FIG. 3 is a graph illustrating the residual stress of B—Si—N system compound films of Example 2 according to the present invention.

FIG. 3 shows the relationship of the atomic ratio of Si/(B+Si) in the input source gas and the residual stress of the obtained films. As shown in the figure, there can be obtained low tension films with the atomic ratio of at least about 0.4, although this also depends on the substrate temperatures.

The compositions of the films were quantitavely determined by means of chemical analysis and EPMA. The results are, in part, given in Table 2.

TABLE 2

| Sample No. | Atomic ratio in source gases | | Substrate Temp. (°C.) | Composition of films (atomic %) | | | Atomic ratio of Si/(B + Si) | Residual Stress* ($\times 10^8$ dyn/cm$^2$) |
|---|---|---|---|---|---|---|---|---|
| | Si/(B + Si) | N/(B + Si) | | B | Si | N | | |
| 1 | 0.43 | 14.3 | 1000 | 16 | 26 | 58 | 0.62 | −5 |
| 2 | 0.48 | 14.8 | 1000 | 15 | 27 | 59 | 0.64 | 5 |
| 3 | 0.54 | 15.4 | 1000 | 12 | 29 | 59 | 0.71 | 17 |
| 4 | 0.67 | 16.7 | 900 | 24 | 18 | 58 | 0.43 | −24 |
| 5 | 0.74 | 17.4 | 900 | 20 | 22 | 58 | 0.52 | −21 |
| 6 | 0.82 | 18.2 | 900 | 15 | 28 | 57 | 0.65 | 4 |
| 7 | 0.90 | 19.0 | 900 | 10 | 34 | 57 | 0.77 | 18 |

As will be apparent from Table 2, when the content of Si in the films is in the range of about 25 to 35 atomic % and the atomic ratio of Si/(B+Si) in the films is in the range of about 0.6 to 0.8, there can be achieved films with a low tension of not more than $20 \times 10^8$ dynes/cm$^2$. In comparison with the low tension films obtained in Example 1, the Si content in Example 2 was somewhat increased. The refractive index of these low tension films was on the order of 1.91 to 2.03 (±0.02).

So long as the structure of the films was examined by X-ray diffraction, all of the films were amorphous. Further, the infrared spectra of the films were similar to those of Example 1.

Further, with respect to sample No. 6 given in Table 2, the central part of the silicon substrate was etched with a 30 wt. % aqueous solution of KOH (110° C.) so as to form a 25 mm×25 mm square window. The film thickness was approximately 1.6 μm. The membrane thus obtained has been confirmed to have a good flatness (not more than 2 μm) within the area of the transmission window.

Figure 4:
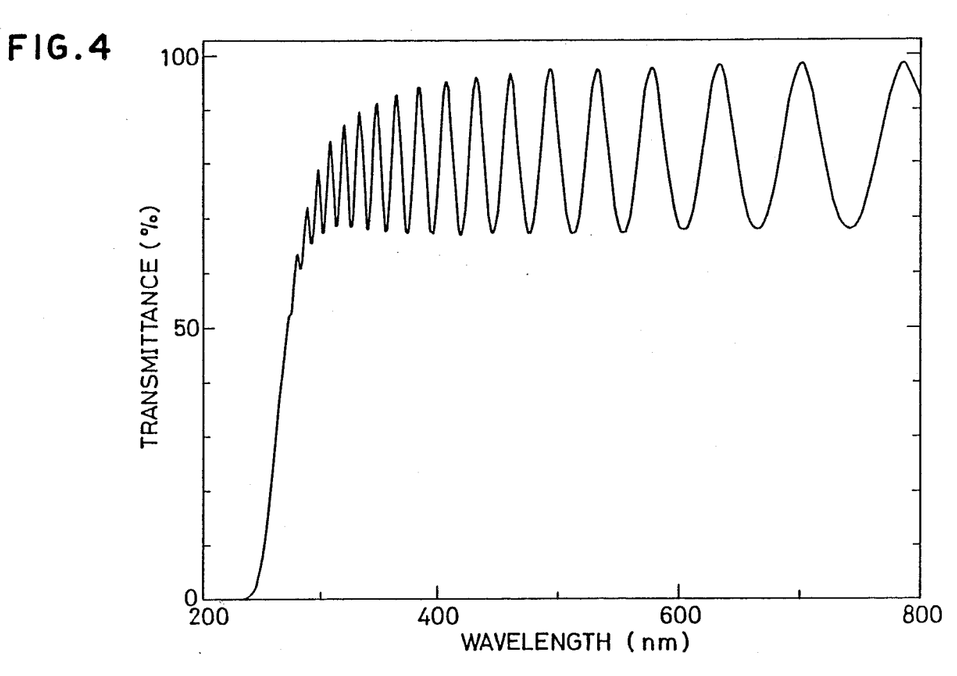
FIG. 4 is the transmittance curve of a membrane for an X-ray mask in Example 2 of the present invention in the ultraviolet-visible region.

The transmittance curve of the membrane in the ultraviolet-visible region is shown in FIG. 4 and vibrations shown in the transmittance curve were due to the interference of multiple reflection. The membrane showed a superior light transmittance in the wave length region of 400 nm or longer. That is, the maximum transmittance was on the order of not less than 94% and even the minimum transmittance was on the order of not less than 65%.

As described above, since, in the B—Si—N system compound membranes of the present invention, the residual stress can be readily controlled by adjusted the conditions for the formation of membranes and high transmittance can be achieved in the visible region, X-ray masks of good performance can be achieved, using the membranes.

What is claimed is:

1. A membrane for use in an X-ray mask, which membrane is an amorphous thin film and consisting of boron (B), silicon (Si) and nitrogen (N), in which the content of Si in said film is at least 15 atomic percent but less than 100 atomic percent, and the atomic ratio of Si/(B+Si) in said film is at least 0.2 but less than 1.0.

2. A membrane as claimed in claim 1 in which said film consists of 5 to 35 atomic % of B, 15 to 35 atomic % of Si and 50 to 60 atomic % of N.

3. A membrane as claimed in claim 1 in which said film has atomic bondings of B—N and Si—N.

4. A membrane as claimed in claim 1 in which said film has a refractive index of 1.7 to 2.1 at a wavelength of 633 nm.

5. A membrane as claimed in claim 1 in which said film has an absorption coefficient of not more than $1 \times 10^{-3}$ cm$^{-1}$ at wavelengths of 488 nm and 633 nm.

6. A membrane as claimed in claim 1 in which said film has a thickness of 0.5 to 10 μm.

7. A membrane as claimed in claim 1 in which said thin film has a thickness of from 1 to 3 μm.

8. A membrane for use in an X-ray mask, which membrane is an amorphous thin film having a thickness of from 0.5 to 10 micrometers, said film consisting of boron (B), silicon (Si) and nitrogen (N) and exhibiting B—N atomic bonding and Si—N atomic bonding, said film consisting of from 5 to 35 atomic % of B, from 15 to 35 atomic % of Si and from 50 to 60 atomic % of N, and wherein the atomic ratio $$\frac{Si}{B + Si}$$

is from 0.2 to less than 1.0.

* * * * *

UNITED STATES PATENT AND TRADEMARK OFFICE
CERTIFICATE OF CORRECTION

PATENT NO. : 4,940,851

DATED : July 10, 1990

INVENTOR(S) : Akira OYOBE et al

It is certified that error appears in the above-identified patent and that said Letters Patent is hereby corrected as shown below:

Column 8, line 61; delete "and".

Column 9, line 9; change "$1 \times 10^{-3} cm^{-1}$" to ---$1 \times 10^{3} cm^{-1}$---.

Signed and Sealed this

Seventh Day of January, 1992

Attest:

HARRY F. MANBECK, JR.

*Attesting Officer*     *Commissioner of Patents and Trademarks*